(12) United States Patent
Hattori et al.

(10) Patent No.: US 7,541,051 B2
(45) Date of Patent: Jun. 2, 2009

(54) NUCLEAR SPIN POLARIZED RARE GAS PRODUCTION DEVICE AND POLARIZED RARE GAS PRODUCTION METHOD USING THIS

(75) Inventors: Mineyuki Hattori, Ibaraki (JP); Takashi Hiraga, Osaka (JP); Morio Murayama, Kanagawa (JP)

(73) Assignees: National Institute of Advanced Industrial Science and Technology, Tokyo (JP); Toyoko Kagaku Co., Ltd., Kanagawa (JP)

( * ) Notice: Subject to any disclaimer, the term of this patent is extended or adjusted under 35 U.S.C. 154(b) by 970 days.

(21) Appl. No.: 10/505,781

(22) PCT Filed: Feb. 17, 2003

(86) PCT No.: PCT/JP03/01647

§ 371 (c)(1),
(2), (4) Date: Oct. 25, 2004

(87) PCT Pub. No.: WO03/071946

PCT Pub. Date: Sep. 4, 2003

(65) Prior Publication Data

US 2005/0084450 A1   Apr. 21, 2005

(30) Foreign Application Priority Data

Feb. 26, 2002 (JP) ............................. 2002-049260

(51) Int. Cl.
*G01R 33/28* (2006.01)

(52) U.S. Cl. .................................................... 424/600

(58) Field of Classification Search .............. 62/55.5, 62/919, 925; 372/74, 73, 70, 69, 34; 417/313, 417/401; 424/600, 604, 9.3
See application file for complete search history.

(56) References Cited

U.S. PATENT DOCUMENTS 5,642,625 A   7/1997  Cates
6,942,467 B2 *   9/2005  Deninger et al. ............ 417/313

(Continued)

FOREIGN PATENT DOCUMENTS

JP   59-188514   10/1984

(Continued)

OTHER PUBLICATIONS

H. Fujiwara et al., "Relaxation Behavior of Laser-Polarized $^{129}$Xe Gas: Size Dependency and Wall Effect of the $T_1$ Relaxation Time in Glass and Gelatin Bulbs", Journal of Magnetic Resonance, vol. 150, No. 2, pp. 156-160, 2001.

*Primary Examiner*—Kiet T Nguyen
(74) *Attorney, Agent, or Firm*—Wenderoth, Lind & Ponack, L.L.P.

(57) ABSTRACT

A device which can produce polarized rare gas further improved in polarization rate with the gas kept flowing, which has flat sheet surfaces facing each other via a gap, and which comprises, a flat-surface flow cell unit for allowing a mixture gas of rare gas and optically-pumping catalyst to flow in the gap there through in one direction thereof, a laser beam irradiation unit for applying a laser beam toward at least one of the flat sheet surfaces to apply an excitation light into the flat-surface flow cell unit, and a magnetic field application unit for allowing a magnetic line of force to pass through the laser beam-applied flat sheet surface perpendicularly or almost perpendicularly; and a method using this device.

16 Claims, 6 Drawing Sheets

U.S. PATENT DOCUMENTS 6,590,923 B1 * 7/2003 Batelaan et al. ............... 372/74

FOREIGN PATENT DOCUMENTS

| JP | 11-248809 | 9/1999 |
| JP | 11-309126 | 11/1999 |
| WO | 01/11379 | 2/2001 |

* cited by examiner

NUCLEAR SPIN POLARIZED RARE GAS PRODUCTION DEVICE AND POLARIZED RARE GAS PRODUCTION METHOD USING THIS

This application is a U.S. national stage of International Application No. PCT/JP03/01647 filed Feb. 17, 2003.

TECHNICAL FIELD

The invention of the application relates to a device for producing rare gas having high nuclear spin polarization rate, and a polarized rare gas production method using this. More particularly, the invention of the application relates to a device for producing rare gas polarized at the high rate of about several dozen percent or more, which is useful for a NMR device, and a polarized rare gas production method using this.

BACKGROUND ART

An important technical problem exists in that rare gas having high polarization rate is achieved by a conventional NMR device.

Herein, the polarization means that the distribution of the number of spins occupying an energy level of a nuclear spin of the atomic nucleus corresponding to the state for the distribution to a main static magnetic field is extremely biased in comparison with the distribution at the thermal equilibrium.

Due to irradiation by circularly polarized excitation light to a mixed with gases, wherein rare gas of the spin quantum number 1/2 of xenon-129($^{129}$Xe), helium-3($^3$He) or the like containing a monatomic molecule having the nucleus spin is mixed with alkali metal steam such as rubidium (Rb) and cesium (Cs), an electron of the ground state level according to rubidium and the like is excited by photoabsorption, followed by being excited to the excitation state level and returning to the ground state level, at one time, the electron likely transits to one level of the electron levels in the ground state level in which the degeneracy is magnetically released by the magnetic field impressed from the outside; thereby the state having the high electron spin polarized degree of the rubidium molecule or the like is produced. The rubidium or the like having the high polarized state is collided with the rare gas xenon or the like, and the high polarized state of the rubidium or the like is moved to the nucleus spin system of the rare gas of the xenon or the like in the process. Thereby, the rare gas having the polarized state is obtained. [W. Happer, E. Miron, S. Schaefer, D. Schreiber, W. A. van Wijngaarden, and X. Zeng, Phys. Rev. A29, 3092 (1984).]. In general, the process is called an optical pumping.

The following device is known as a conventional device for producing the polarized gas. The mixture gas of a rare gas and alkali metal steam is enclosed in an optical reactive container, and the mixture gas is irradiated with the excitation light and the magnetic field is impressed to the mixture gas. For example, for the sake of using the polarized helium-3 having the high density as a neutron polarizer, the mixture gas of helium-3 gas and nitrogen, and an alkali metal are enclosed in a cylindrical glass ampoule, and thereby the polarized gas is produced. [M. E. Wagshul and T. E. Chupp, Phy. Rev. A40, 4447 (1989).].

The following method is known as a device in which the polarized rare gas of xenon-129 is applied to the nuclear magnetic resonance measurement (NMR) and the magnetic resonance imaging measurement (MRI). The method wherein NMR signal of the polarized xenon-129 is measured by using xenon-129 and rubidium introduced to the cylindrical glass container, and also the method of measuring the NMR signal of the proton-1 is measured whereby spin polarization is forwarded by applying nucleus Overhauser effect to the proton-1 nucleus from the polarized xenon-129 nucleus [D. Raftery, H. Tong, T. Meersmann, P. J. Grandinetti, L. Reven, and A. Pines, Phy. Rev. Lett. 66, 584 (1991) and G. Navon, Y.-Q. Song, T. Room, S. Appelt, R. E. Taylor, and A. Pines, Science 271, 1848 (1996)], is known. It is also known the polarized xenon-129 is introduced to an animal to measure the image of a cave such as a lung [M. S. Albert, G. D. Cates, B. Driehuys, W. Happer, B. Saam, C. S. Springer Jr., and A. Wishnia, Nature 370, 199 (1994) and U.S. Patent (U.S. Pat. No. 5,545,396 (1996)].

In any case, the operation for improving the polarization rate is performed by entering the excitation beam from one direction in the state where the rare gas or the like is stayed in a light response container. When the polarization rate rises, the rare gas or the like is cooled off, and is used as the neutron polarizer. The polarized rare gas is transported from the glass vessel to another container, and is used for NMR measurement or the like.

On the other hand, the following device and method are known as a device and a method for producing the polarized rare gas while making the gas flow. For example, xenon-129 of 1% is mixed with a buffer-gas of helium-4 gas of about 10 atmospheres, and the mixture is introduced to a cylindrical glass container. The mixture is irradiated with the excitation beam in parallel to the flow of the gas. That is, such an irradiation is carried out from the gas exit side of the container of the column bottom direction of the cylindrical glass container to the introduction side. From the gas exit of the container, the polarized mixed gas is induced in a dewar cooled off by a liquid nitrogen, and following separating the polarized xenon-129 as a solid, and being exhausted from a bent-line. [B. Driehuys, G. D. Cates, E. Miron, K. Sauer, D. K. Walter and W. Happer, Appl. Phys Lett 69,1668 (1996).].

In addition, in the polarized rare gas production device that the inventors of the application have proposed, the polarized rare gas is produced while making the gas flow safely near the normal pressure by using the flow cell, and a nuclear magnetic resonance device is arranged backward thereof; thereby, NMR measurement can be performed in a short time without decreasing the polarization rate after polarized rare gas is continuously generated [Hattori, Hiraga, Nakai, Moriya, John M. Tracy, Japanese Unexamined Patent Application Publication No. 11-309126].

However, in a device wherein the gas or the like is stayed in a conventional cylindrical glass and the gas is excited and polarized, the strength of the excitation light, depending on the distance from the plane of incidence in the direction of the incidence, is exponentially decreased. The density of rubidium or the like in the cylindrical glass container is optimized and determined to the part where excitation light is strong; thereby, in a part which is away from the plane of incidence and in which the excitation light is weak and occupies a considerable volume.

Molecules such as xenon are moved to the part having high efficiency by diffusion and convection, and thereby the decrease in the polarization rate in the part having low excitation efficiency is dissolved. But, the decrease in the polarization rate causes the decrease in the entire excitation efficiency.

A problem exists in that in a conventional device which stays gas or the like, and in which the gas is polarized, the polarized rare gas can not be continuously generated, and time is required for taking out the polarized gas to another container separately and carrying to the NMR device or the like, and the polarization rate is decreased in the mean time.

On the other hand, in a device which produces the polarized rare gas while making the gas flow, the following problems exists. Since the buffer gas of the high pressure is introduced so as to reduce the los of the polarization rate due to the intermolecular collision of the polarized xenon-129, there is a danger of handling a gas. In addition, the polarized xenon-129 solidified is heated again and must be taken out to a cool dewar, and the time is required for NMR measurement. In addition, the amount of xenon-129 polarized actually by the device is about 5%.

Further, the excitation light is incidence only from one direction in the device which the polarized rare gas is produced while the gas is made to flow near the normal pressure by using the flow cell that inventors of the application, have already proposed. Thereby a problem exists in that the polarization rate is decreased in a part away from the light source.

Therefore, the invention of this application dissolves the conventional problem described above. It is a subject of the invention of this application that a polarized rare gas production device in which the polarization rate is improved while the gas is safely made to flow, and a polarized rare gas production using the device are proposed by making the best use of the features of a device and a method that inventors of the application have proposed and improving the cellular shape and the excitation light source. The subject of the invention of the application is to provide a nuclear magnetic resonance detection device which NMR and MRI measurement can be performed in a short time and without decreasing the polarization rate after the polarized rare gas is continuously generated by such an improved device and a method, and NMR and MRI measuring method using the inventive device and enabling a detection in a ultra small area with the high sensitivity and shortened measurement time.

DISCLOSURE OF INVENTION

This application has been made to solve the above problems. A nuclear spin polarized rare gas production device of the first invention comprises a flat-surface flow cell unit which has flat sheet surfaces facing each other via a gap. In the gap of the flat-surface flow cell unit, wherein a irradiation area can make the best of the light power density of the irradiated laser beam sufficiently, a mixture gas of rare gas and optically-pumping catalyst flows in one direction. Simultaneously, an excitation light is applied into the flow cell unit having the gap, and a magnetic field is applied so that a magnetic line of force pass perpendicularly to the irradiation surface of the flow cell unit, wherein the excitation light is applied. The alkali metal such as rubidium (Rb) is selectively deposited on the surface opposite to the laser irradiation surface of the flat-surface flow cell unit to which the laser beam is applied so as to improve the vapor pressure of the alkali metal as the optically-pumping catalyst, for example, the alkali metal such as rubidium (Rb), and the vapor pressure thereof is improved.

In a nuclear spin polarized rare gas production device of the second invention, when the alkali metal such as rubidium (Rb) is selectively deposited on the surface facing the laser beam irradiation surface of the flat-surface flow cell unit, both rubidium (Rb) reservoir and the flat-surface flow cell unit are in a high vacuum state of $10^{-5}$ Pa or less. The high temperature (for example, 150° C.) is maintained in the pipe containing the reservoir of the alkali metal such as rubidium (Rb), and the temperature of the surface facing the laser beam irradiation surface of the flat-surface flow cell unit is maintained lower from them by about 50° C. to 200° C. (for example, about 50° C.).

In a nuclear spin polarized rare gas production device of the third invention, when the mixture gas of the rare gas and the optically-pumping catalyst flows to one direction in the flat-surface flow cell unit, by the arrangement and the action of a temperature control unit, the temperature (for example 400° C.) to maintain the vapor pressure of the optically-pumping catalyst whereby the strength of the laser beam on the surface facing the laser beam irradiation surface of the flat-surface flow cell unit decreases 1/10 or more of that of the laser beam on the laser beam irradiation surface.

In a nuclear spin polarized rare gas production device of the fourth invention, the flat-surface flow cell unit is made of a material (for example, quartz glass and sapphire) which substantially does not absorb the laser beam applied, for example, the laser beam having the wavelength of about 795 nm (accurately, 794.7 nm:Rb), and does not discharge water or volatile components from the inner wall of flat-surface flow cell unit heated when the polarized rare gas is produced.

In a nuclear spin polarized rare gas production device of the fifth invention, a magnet (for example, a permanent magnet and a Helmholtz coil) having an air core structure is selected so as to secure a space for storing the flat-surface flow cell unit and the heating mechanism thereof.

In a nuclear spin polarized rare gas production device of a seventh invention, when the mixture gas of the rare gas and the optically-pumping catalyst flows to one direction in the flat-surface flow cell unit, the surface of the pipe inner wall, wherein the laser beam is not irradiated and arranged in a downstream the part where the excitation light is irradiated, is coated by a material which does not promote the disappearance of the polarized rare gas, or is selected by the material which does not promote the disappearance of the polarized rare gas.

In a device of the seventh invention, a nuclear magnetic resonance device is arranged in the downstream of the flat-surface flow cell unit, and the polarized rare gas is continuously generated to perform NMR measure in a short period of time without substantially reducing the polarization rate.

In a device of the eight invention, rubidium (Rb) of the alkali metal is preferable as the optically-pumping catalyst. In a device of the ninth invention, the quencher gas is flowed as a part of the mixture gas in the flat-surface flow cell unit.

In a device of the ninth invention, rubidium (Rb) of the alkali metal is preferable as the optically-pumping catalyst. In a device of the tenth invention, the quencher gas is flowed as a part of the mixture gas in the flat-surface flow cell unit.

In a method of the tenth invention, the polarized rare gas is produced by using the above device.

Figure 1:
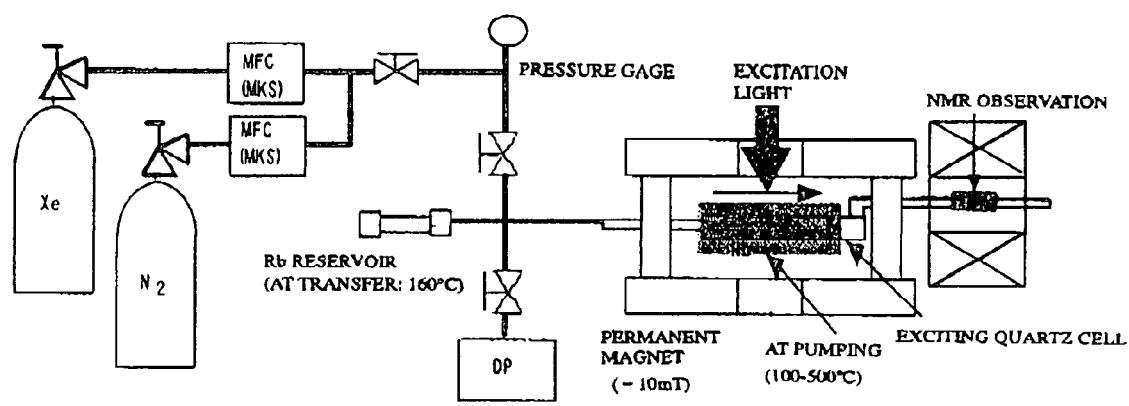
FIG. 1 is a configuration view illustrating the schematic configuration of the polarized rare gas production device of the invention of the application.

Reference numerals shown in Figures designate the followings.
1A, 1B: flat sheet surface
2: gap
3: metal
4: glass
5: Rb (rubidium)

BEST MODE FOR CARRYING OUT THE INVENTION

The invention of the application has the above characteristics, and hereinafter the embodiment will be described.

In the invention of the application, the cell of a nuclear spin polarized rare gas production device has a large acceptance area. The shape of the cell is improved to the plane type such that an excitation beam source enters to the entire surface of the cell and the excitation beam coincides with the half width of the light absorption of optically-pumping catalyst such as rubidium. The polarized rare gas can be produced at the high polarization rate by irradiating with the irradiation beam using a high power (for example, 40 W) laser diode array or the like, by applying a magnetic field, and also together by flowing the optically-pumping catalyst and the quencher gas is flowed in one direction in the flow cell unit, and wherein thereby the mixture gas of the rare gas of normal pressure. Measurements can be performed by using NMR and MRI devices arranged behind the polarized rare gas production device.

Hereinafter, referring to the drawings, the embodiment of the invention of the application will be described.

FIG. 1 is an overall schematic configuration view of a polarized rare gas production device and a magnetic resonance detection device of the invention of the application. Xe is shown as a rare gas. The gas is not limited to the rare gas, and any known gases having a nuclear spin can be used. Particularly, the gases having a nuclear spin of which the spin quantum number is 1/2, for example, the rare gases such as xenon-129 and helium-3 are preferable.

In FIG. 1, the rare gas (Xe) is supplied from a steel cylinder. However, a container for supplying the rare gas is not limited to the steel cylinder, and any known gas supply devices such as a curdle, a houseline from a large size tank installed the outdoor and a low temperature preservation container can be used.

In the example shown in FIG. 1, nitrogen gas (N2) is used as quencher gas. The optically-pumping catalyst excited by the excitation beam irradiation has a sub-process of returning to a ground state by a non-radiative transition besides a main process of returning to the ground state by a spontaneous emissions. The optically-pumping catalyst can be returned to the ground state in a short period of time by introducing the quencher gas and transmitting the energy of the middle level of the optically-pumping catalyst to the quencher gas since the easing time of the sub process is long. If the quencher gas does not exist in the cell, the polarized gas can be produced. However, the quencher gas preferably exists.

Hydrogen, nitrogen, organic gas having unsaturated bond, and organic gas having the unsaturated bond (for example, acetylene, benzene, π-electron compounds or the like) can be use for the quencher gas, and particularly, the nitrogen is preferable. In FIG. 1, the quencher gas is supplied from a steel cylinder. However, a container for supplying the quencher gas is not limited to the steel cylinder, and any known gas supply devices such as a curdle, a houseline from a large size tank installed the outdoor and a low temperature preservation container can be used.

Though the rare gas and the quencher gas are connected in the example shown in FIG. 1, gas for cleaning may be additionally connected. The gas for cleaning removes impurities such as moisture and oxygen in a gas pipe and a cell before the rare gas and the quencher gas are introduced. In addition, the gas for cleaning is flowed to remove air from the outside and moisture which is gradually desorbed from the inner wall while the rare gas and the quencher gas are stopped. The invention of the application can be executed even if the gas for cleaning is not used. However, it is preferable to use the gas for cleaning. The gas for cleaning can be supplied by the steel cylinder for nitrogen and argon or the like, the curdle, and the houseline from the large size tank installed the outdoor.

In the example shown in FIG. 1, the rare gas and the quencher gas are introduced into a flow cell after the pressure is lowered from a high pressure to the vicinity of a normal pressure by a pressure regulator. The pressure is preferably within the range of the atmosphere pressure to 10 atmospheres and particularly preferably the atmosphere pressure to 3 atmospheres.

After the rare gas and the quencher gas pass through the pressure regulator, the flow rate of the rare gas and the quencher gas is controlled by a mass flow controller. Any commercially available gas flow adjusters such a flow meter, a flow meter with a needle valve, an orifice, a mass flow meter, and a mass flow controller can be used, and particularly, the mass flow controller is preferable. Though the laminar flow region or the mixture region of the laminar flow and turbulent flow is used in the flow rate so as to prevent the decrease in the polarization rate of the polarized rare gas by the collision to the gas intermolecular, the pipe wall and the cell inner wall, the laminar flow region is particularly preferable.

The rare gas and the quencher gas which pass through the mass flow controller are introduced into the cell after passing through a gas drying device and a gas highly purifying device and impurities are excluded. Since moisture, oxygen, carbon dioxide, carbon monoxide, and other impurities decrease the efficiency of optical pumping by reacting with the optical pumping agent, and ease spin system when colliding with the polarized rare gas to decrease the polarization rate of the rare gas, it is preferable that the gas introduced in the cell has high purity.

When a high-purity gas is used, the gas drying device may be used though the gas drying device is not necessarily acquired. The gas drying device removes moisture contained in the gas. Though the gas can be refined by only the gas highly purified device without using the gas drying device, it is preferable to use the gas drying device in view of extending the use longevity of the gas highly purified device. The gas drying device is essential when only low purity gas can be used. Any known absorbents such as molecular sieve and a silica gel may be used for the gas-drying device in the invention, and particularly, the molecular sieve heated and dried previously is preferable.

The gas highly purifying device is used for excluding oxygen, carbon dioxide, carbon monoxide, and other reactive impurities, and any available commercially gas defectors such as a getter type, a resin type and a metal complex type can be used for the invention.

In the example shown in FIG. 1, the rare gas and the quencher gas which pass the gas highly purifying device are introduced into the cell. Rb for the optical pumping agent, in a word, the optically-pumping catalyst is previously moved to the cell. Herein, the optical pumping agent is a material having the following nature. When an electron of the ground state level is excited by photo absorption, goes through the excitation state level and returns to the ground state level by irradiating the circularly polarized light excitation tight, the electron is likely to change to one level of the electron levels in the ground state level in which the degeneracy is magnetically released by the magnetic field impressed from the outside, and thereby the state having the high electronic spin polarized degree can be produced. For the optically-pumping catalyst in the invention of the application, an alkali metal atom such as cesium, rubidium and sodium, a metal atom such as a mercury atom, lead and cadmium, monatomic molecules of a metastable state such as a mercury atom, lead and cadmium, monatomic molecules of a metastable state such as a helium atom of a metastable state generated by electric discharge, and polyatomic molecule such as an organic radical and an inorganic radical may be used.

In the method for introducing the optical pumping agent, beforehand, the optical pumping agent is transported to the surface facing the optical irradiation surface of the polarized flow cell unit from a container stow the optical pumping agent by using the temperature difference under a vacuum condition, and it is preferable that the rare gas and the quencher gas are mixed while the optical pumping agent is evaporated by heating.

For the sake of preventing the optical pumping agent in the invention of the application from segregating by the inhomogeneous temperature distribution, the container storing the optical pumping agent is cooled while irradiating light. It is preferable that the entire cell is maintained at a uniform temperature. It is preferable to determine the temperature in consideration of the saturated vapor pressure so as to control the density of the optical pumping agent.

Figure 2:
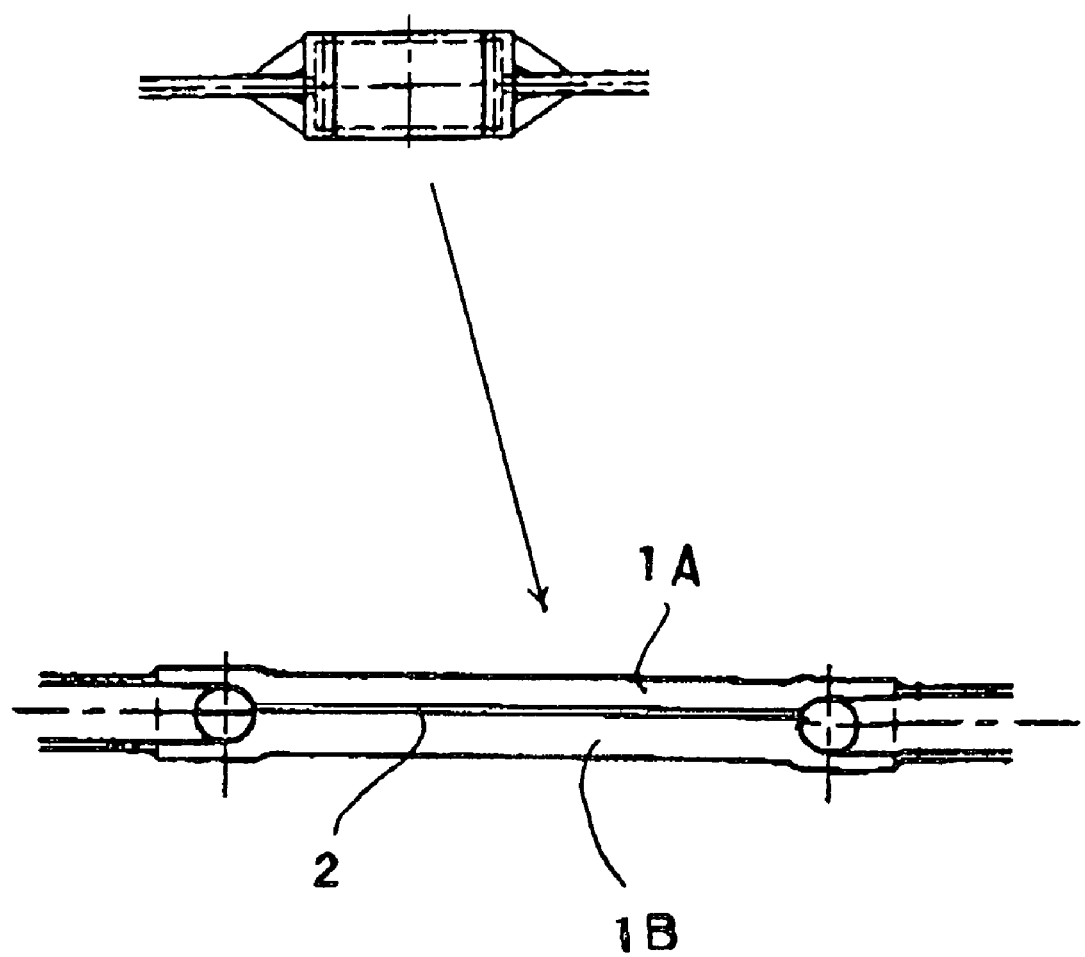
FIG. 2 is a configuration view illustrating the configuration of the flat-surface flow cell unit.

FIG. 2 is a plan view illustrating the flat-surface flow cell unit of the polarized rare gas production device in the invention of the application and an enlarged sectional view thereof. It consists of a pair of flat sheet surfaces (1A), (1B) which are supported by a sidewall and are arranged opposite to each other in upper and lower, and a gap (2). It is preferable that the flat-surface flow cell unit has the following structure: (1) the acceptance area is enlarged as much as possible to make the best use of the strength of the light source for the excitation light and to efficiently generate exited state of rubidium or the like; (2) the thickness of the flow cell unit is thin so as to limit such that the mixed gas exist in only the area in which the beam entering from the acceptance area is absorbed by rubidium or the like in the flow cell unit and the strength of the beam is decreased and becomes 1/10 of the strength at entering; (3) the entire cell is made of a material which can be heated at 200° C. or more so as to desorbs water molecules or the like adsorbed to the cell inner wall easy; (4) the magnetic field application unit is arranged such that the direction of the incidence of light is coincided with or almost coincided with that of the magnetic line.

Metals such as a surface treated stainless steel, tantalum, molybdenum, platinum, rhenium, titanium, tungsten, zirconium and copper, a glass such as quartz may be for the material of the flow cell unit. A part or the whole of the cell has preferably a window for an optical incidence. Quartz and sapphire, which have excellent permeability, can be used for the window.

Figure 3:
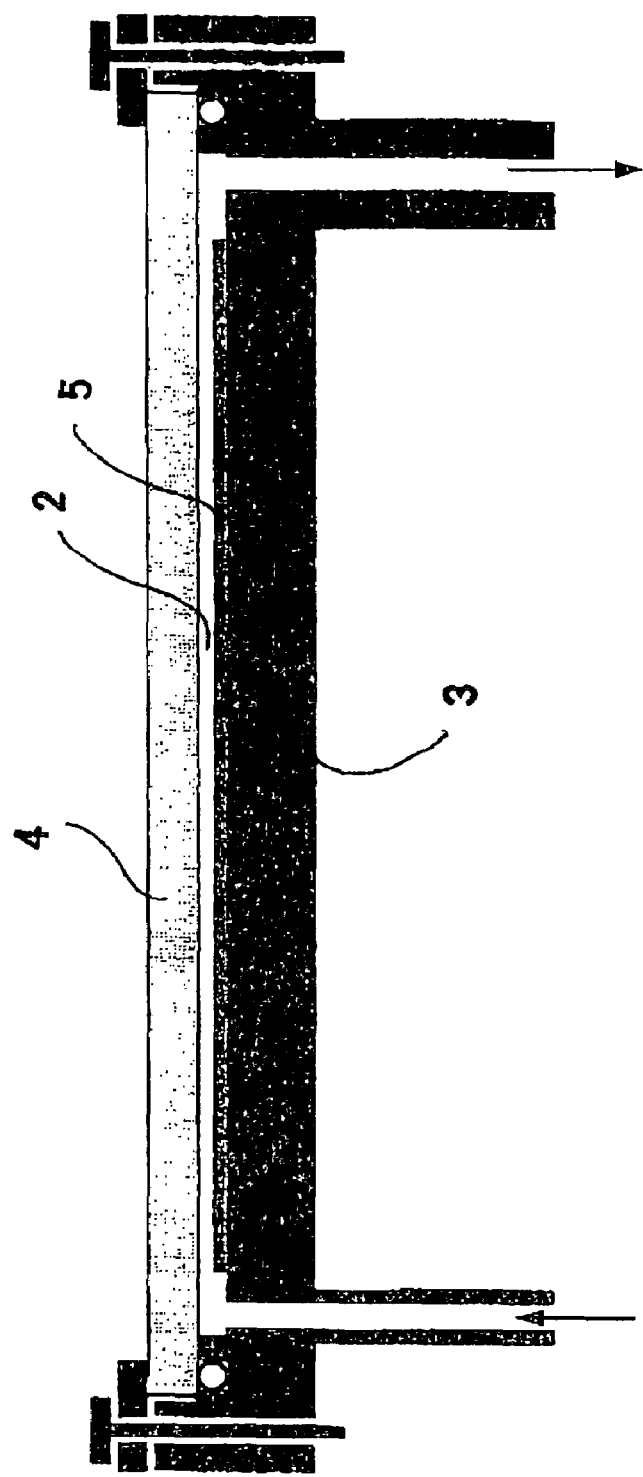
FIG. 3 is a configuration sectional view illustrating the configuration side of the flow cell by a metal and a glass.

FIG. 3 is a sectional view illustrating configuration view of a cell having a gap (2) made of a metal (3) and a glass (4). Rb (5) is deposited on the side of the metal (3).

Figure 4:
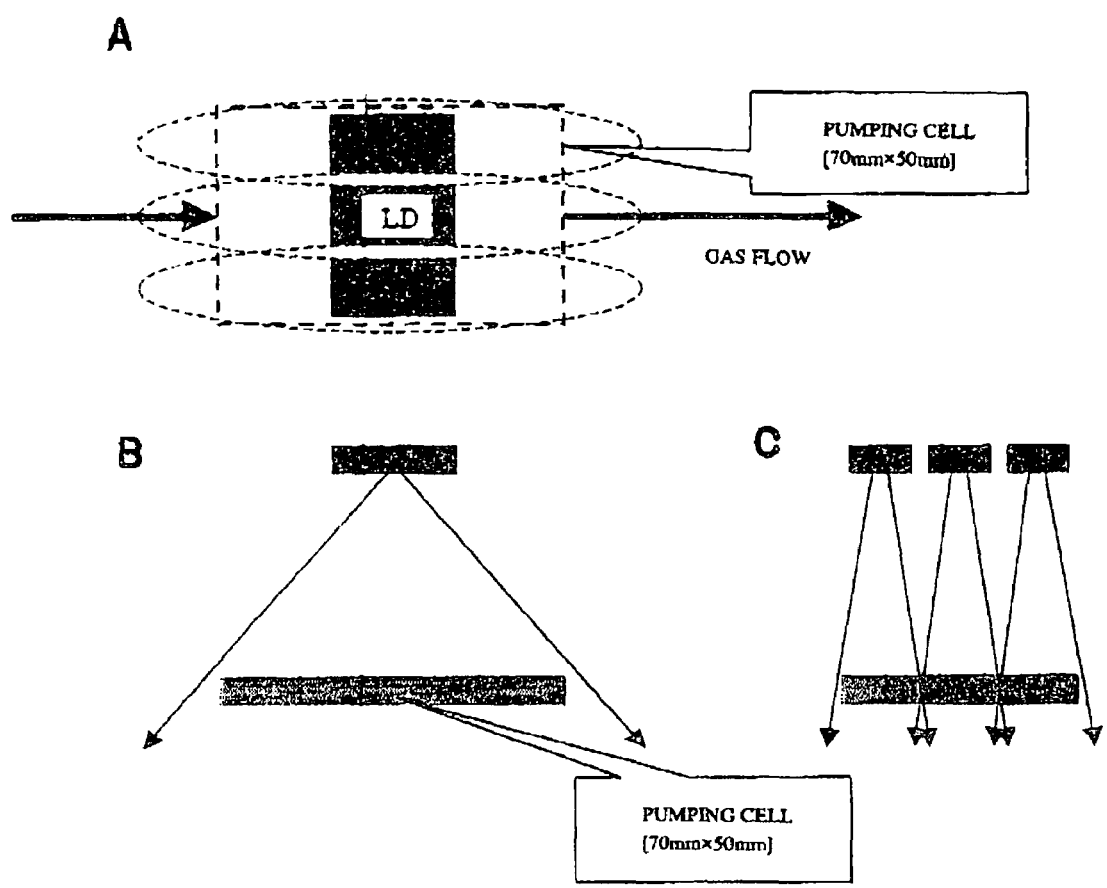
FIG. 4 is a configuration view illustrating the arrangement of a high power laser diode array.
Figure 5:
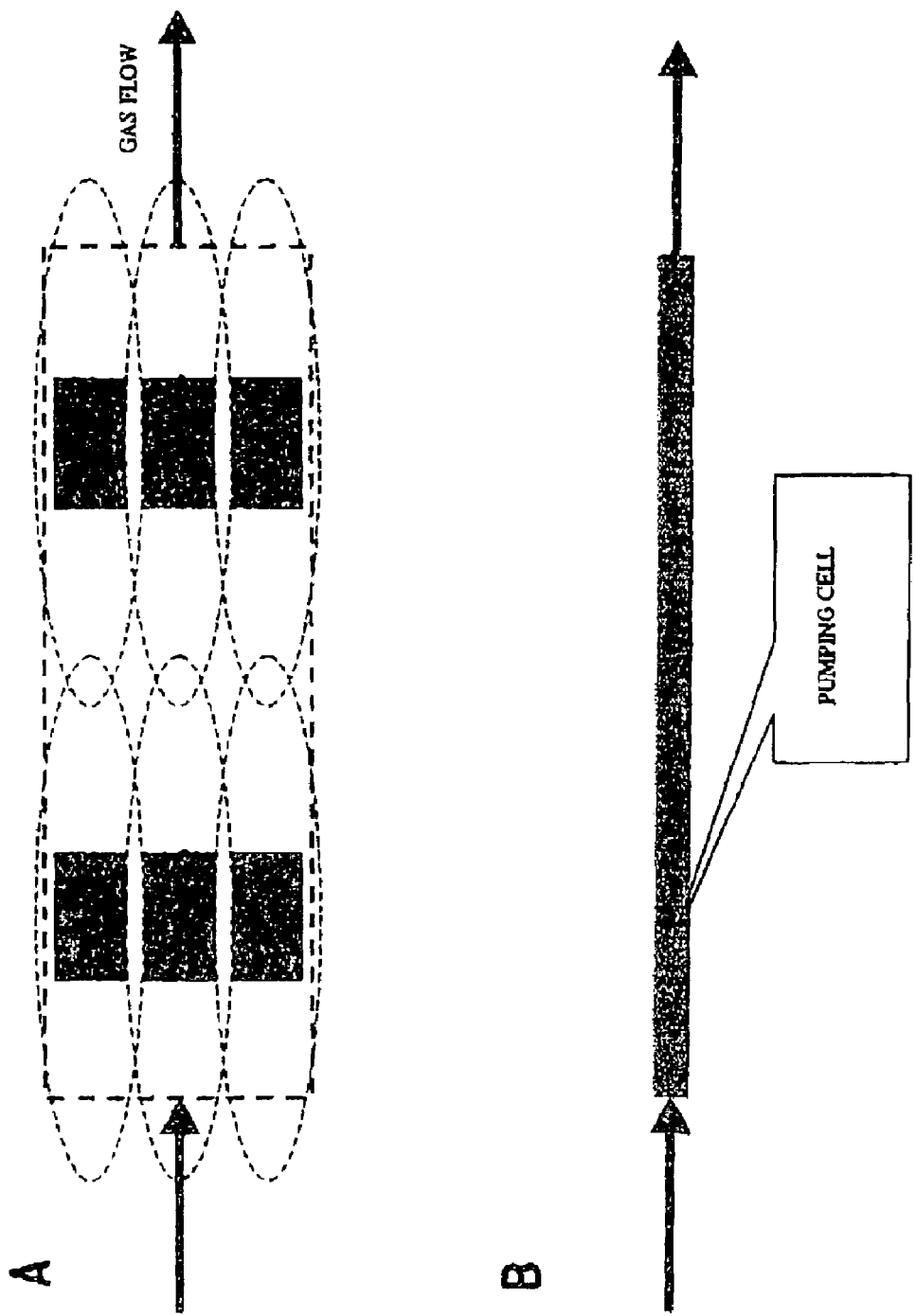
FIG. 5 is a configuration view illustrating the arrangement of a high power laser diode array which is different from FIG. 4.
Figure 6:
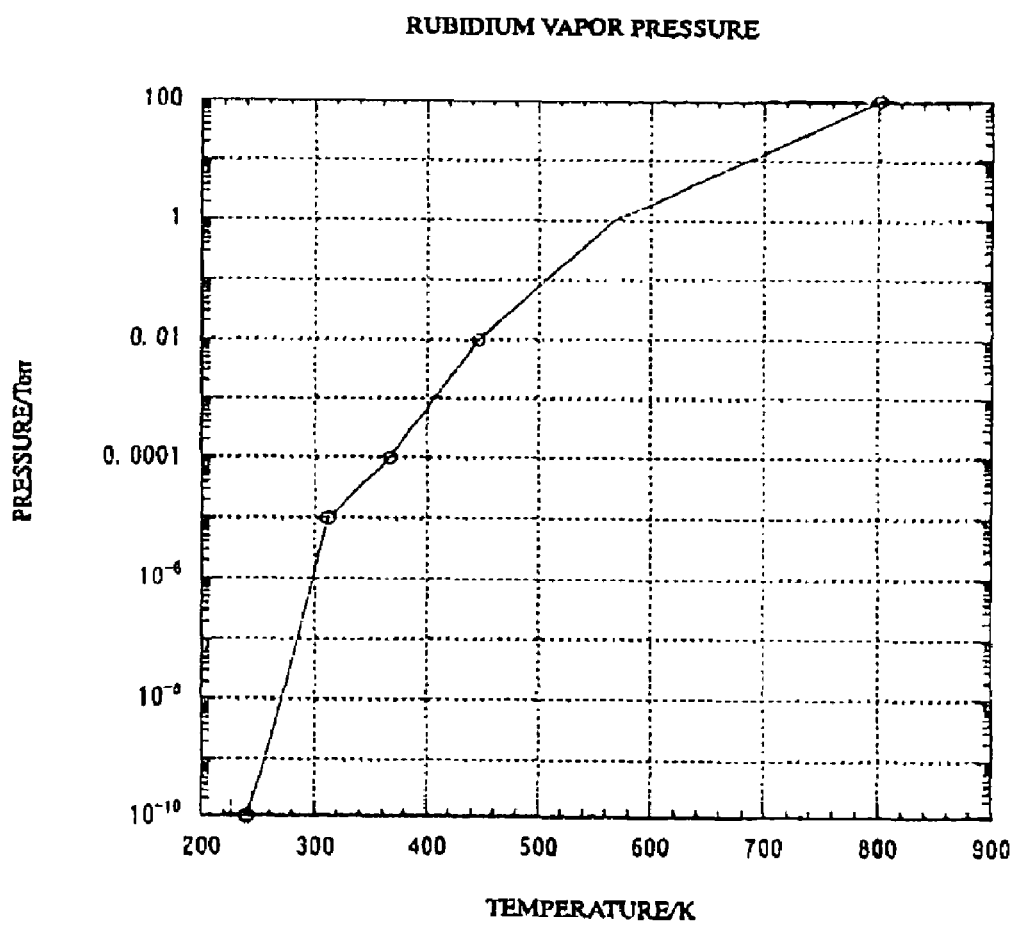
FIG. 6 is a vapor pressure diagram of rubidium.

FIGS. 4 and 5 are configuration views illustrating the arrangement of a high power laser diode array of the invention of the application as a plan view (A), a side view (B) and a front view (C). A lamp and a laser or the like can be used for an excitation light source, and particularly, the laser diode is preferable. A ¼ wavelength plate can be arranged in front of the excitation light source so as to converting a linearly polarized light into a circularly polarized light. A lens obtained by combining by a concavoconvex cylindrical lens may be used for an expander.

For example, preferably, the diode array is a linear array having the same length as that of the direction of the flow of the flow cell.

For example, as shown in FIG. 1, in the invention of the application, a magnet having an empty core structure such as a permanent magnet or the like is used for the magnetic field application unit. In the example shown in FIG. 1, the magnet is arranged such that the direction of the incidence of light is coincided with that of the magnetic line. The direction of the incidence of the excited light is arranged in parallel with or approximately in parallel with that of the magnetic line so as to perform the optical pumping. It is the largest effect for improving the polarization rate while the gas is flowed that the direction of the flow of the gas is vertical or almost vertical to both the incidence direction of excited light and the magnetic line. Therefore, it is an especially preferable structure in the invention of this application that the excitation light is vertically irradiated to the direction where the gas contained in the flow cell is circulated, and that the magnetic line pa; vertically to the excitation light irradiation surface of the flow cell.

As shown in FIG. 1, the rare gas polarized by the cell is introduced into a rear magnetic resonance detection device, and the magnetic resonance detection measurement is performed. The magnetic resonance imaging apparatus of an inductive detection type of a pulse method, an optical microscope device detecting photo detection NMR tinder RF irradiation, or force detector type of a scanning probe microscope device using the principle of AFM or the like can be used for the magnetic resonance detection device used herein.

If a pulse type inductive detection method is applied in a conventional staying type rare gas polarized device, a problem exists in that xenon 129 having the long easing time is saturated. However, since the polarized rare gas molecules related to the measurement are subsequently counterchanged in the magnetic resonance detection device of the invention of the application, the nuclear magnetic resonance signal can be measured without receiving the influence of saturation.

EXAMPLE

Then, example is shown below, and the invention of the application will be described. Of course, the invention is not limited to the following example.

In the example, the device illustrated in FIG. 1 is used.

Xenon (purity: 99.95%) of a natural isotopic ratio manufactured by Nippon Sanso (xenon-129:26.44% content) is used for the rare gas, and nitrogen gas of S grade (purity: 99.9999%) manufactured by Nippon Sanso is used for the nitrogen gas. Each flow rate is controlled by a valve and mass flow controllers (trade name: M-100-11C, M-310-01C, manufactured by MKS Corporation). The gases are then mixed in a line, and are introduced into a flat-surface flow cell unit placed in a permanent magnet having an air core structure. At this time, the cell is controlled at the temperatures of about 150 to about 300° C. by a hot wind blowing heating device. In the flat-surface flow cell unit, rubidium (Rb) may be previously deposited as described in FIG. 3. When both the rubidium reservoir and the flow cell unit are in a high vacuum of $1 \times 10^{-5}$ Pa in the deposition, the temperature of the flow cell unit is set such that the temperature of the flow cell unit is about 80° C., lower than the that of the reservoir and the pipe.

The mass flow controller is use for controlling the flow rates of the rare gas and the reactive control nitrogen in the flow cell. As the maximum flow rate and the minimum control flow rate of the rare, 10SCCM, 0.2SCCM and 1.0SCCM, 0.02SCCM are used respectively.

A stainless steel 304 pipe of which one end is sealed and which has the outside dimension of 12 mm and the thickness of 0.5 mm is used for the rubidium reservoir. Rubidium (purity: 99.99%) manufactured by Furuuchi Chemical Co., Ltd. is used. The rubidium is inserted into the reservoir as a glass ampoule. A vacuum exhaust is performed for about two days until an attainment pressure is obtained by a vacuum exhaust device with an oil diffusion pump of the attainment pressure of about $10^{-7}$ Pa. At this time, a tape heater is fix to around the rubidium reservoir, and is heated up to about 100° C. Impurities such as the water adsorbed to the cell inner wall and the outside of the glass ampoule are removed. The tape heater of the rubidium reservoir is removed and is returned to the room temperature.

The hot wind blowing heating device is used for equalizing the temperatures of the all part containing the pipe where the rubidium vapor between the rubidium reservoir and the flow cell exists, and the temperature is controlled by a temperature controller within ±1° C. of a set value. Since the rubidium vapor pressure in the flow cell changes by variations in temperature, the vapor pressure is segregated when the low temperature part exists even in the part and it is difficult to control the rubidium vapor pressure. Thereby, it is necessary to maintain the whole uniformly. The mixture gas which comes out the flow cell and is polarized is cooled naturally, and the rubidium vapor is excluded.

The flat-surface flow cell has the internal width of 70 mm in the direction of the now of the gas, the internal width of 50 mm in the direction vertical to the flow, and the respective outside sizes of 80 mm and 60 mm, and is made of quartz glass. The length of the flat-surface flow cell is longer than that of the illuminated part of the laser diode of 60 mm only by about 10 mm. The gap in the part where the gas flows is 1 mm, and the gap is adjusted such that the gap is 1/10 or les of amount of light incident on the surface of the silica glass tube at the following conditions, and the gap becomes uniform over the length of 70 mm.

A linear array assembly of the laser diode on which the illuminated part has the length of 60 mm is set. The ¼ wavelength plate in front of each array is set, and thereby the linear polarized light is converted into the circularly polarized light. The irradiation area and the arrangement are determined by a beam expander such that the circularly polarized light makes the best use of the beam extension angles (5.5 degrees and 35 degrees) of the laser diode.

The laser diode array (LD) assembly has a center oscillation wavelength of 794.7 nm. The laser diode array (LD) assembly of which the entire length of the luminescence part is set to 60 mm is arranged on a tabular heat sink. The entire output of the assembly is 150 W, and the beam extension angle in the direction vertical to the direction of the flow is 35 degrees.

The ¼ wavelength plate used has the size in which the front surface of one unit of LD is covered with one sheet thereof.

The permanent magnet is composed of two groups of meet which is arranged in small tabular permanent magnets at respective upper and lower steps, and the strength of the magnetic field in the gas flow part of the flow cell is set to 0.01 teals (T).

As shown in FIG. 1, the amount of the polarized rare gas generated is measured from NMR signal strength of xenon-129 by using a magnetic resonance imaging apparatus arranged downstream of the glass tube. Herein, devices of one's own making such as an electromagnet for static magnetic field, a coil for RF irradiation, a RF amplifier and a NMR detecting coil and an amplifier are used for the magnetic resonance imaging apparatus which is used for the measurement. Each part is adjusted such that the frequency of a detector is set to 3.5 MHz with proton and xenon-129.

Next, the polarized rare gas is generated by the following experiment procedures. First of all, the valve of the vacuum line is opened for preparing, and the vacuum exhaust is performed for about two days. Thereby, the pipe containing the flow cell is dried and is highly purified. At this time, the gas lines other than the rubidium reservoir mm rolled by a ribbon heater, and are controlled at about 150° C. A stainless steel 304 pipe of the rubidium reservoir of the wall thickness of 0.5 mm is clipped by a clamp from the outside; thereby, the internal glass ampoule is crushed, and the rubidium metal is filled in the reservoir. Then, the power supply of a thermostatic chamber controlling the temperatures of the rubidium reservoir and the flow cell for optical pumping is turned on and such a control is started at 94° C. As shown in FIG. 5, the vapor pressure of the rubidium is $10^{-8}$ Torr at 0° C., about $10^{-5}$ Torr at 38.89° C., and $10^{-4}$ Torr at 94° C. In this example, the vapor pressure of the rubidium is set to $10^{-2}$ Torr at 200° C.

Afterwards, the valve of the nitrogen line for dryness is shut, and the valves of the xenon for light response and nitrogen are opened respectively. The flow rates are respectively adjusted to 6SCCML and 0.1SCCM by adjusting the mass flow controller. In this case, the stay time of the mixture gas in the cell is estimated for about 30 seconds. After the mixture gas of the xenon and nitrogen reaches the NMR detector, the signal level is recorded.

The power supply of the laser diode (LD) is turned on, and the flow cell is irradiated with the circularly polarized light. The output signal of the detector is recorded. The power supply of the laser diode is intermitted for confirmation, and the output signal of the detector at this time is recorded. On the other hand, the glass tube having the same size as that of the glass tube used at the experiment of the polarized xenon is filled with water having a known magnetic susceptibility, and the glass tube is made to the reference of the polarization rate calculation by measuring the signal obtained when inserted in the detector.

The ratio of the size of the spin magnetization contributing to the signal in the proton at the thermal equilibrium and xenon-129 of the polarization rate of 100% is 1:10000. By using such a relation, the polarization rate of xenon-129 can be estimated from the NMR signal strength obtained by the gyromagnetic ratio of proton and xenon-129, and from the experiment using the same volume of water and polarized xenon. The maximum value of polarization rate of the xenon-129 is 40 percent according to the signal strength and the NMR signal strength obtained by the configuration using the water having the same volume.

The description is summarized as follows. The signal strength of the polarized xenon generated is monitored and the output wave pattern of the magnetic resonance detection device changes reversible corresponding to the change of the time of strength of the diode laser beam when the polarized rare gas production device is irradiated with the high power diode laser beam. That is, it is confirmed that the amount of generation of the polarized xenon can be controlled by the increase and decrease of strength of the diode laser beam or the intermission, in other words, the sensitivity of the NMR signal of xenon-129 is reinforced about 10,000 times or more by irradiating the diode laser beam.

INDUSTRIAL APPLICABILITY

The following effects can be achieved as described above in detail according to the invention of the application.

That is, the polarized rare gas can be produced safely and continuously by circulating the mixture gas of a rare gas of the low pressure and optically-pumping catalyst to one direction in the flat-surface flow cell unit, and by irradiating the excitation light and applying the magnetic field in the flow cell. The polarization rate can be dramatically improved by efficiently irradiating the excitation light in the flow cell whereby the high power laser diode array arranged straight is used for the excitation light source.

Furthermore, the polarized rare gas production device is arranged in forward of the magnetic resonance imaging apparatus, whereby the polarized rare gas continuously generated is coated so as to decrease the easing of the nuclear spin by a magnetic interaction with the pipe inner wall; thereby, the polarized rare gas continuously generated can be introduced into the magnetic resonance imaging apparatus in a short period of time without causing the decrease in polarization rate by transportation to another container, and the magnetic resonance imaging measurement can be performed.

Moreover, since the polarized rare gas is used for detection nucleus, the detection sensitivity of the NMR signal can be improved, and it is enabled that the measurement time of the NMR spectrum and the MRI image measurement is greatly shortened, and also that the detection area may be extremely miniaturized.

The invention claimed is:

1. A nuclear spin polarized rare gas production device comprising:
   a flat-surface flow cell unit which has flat sheet surfaces facing each other via a gap, and allows a mixture gas of rare gas and optically-pumping catalyst to flow in the gap in one direction thereof;
   a laser beam irradiation unit for applying a laser beam toward at least one of the flat sheet surfaces to apply an excitation light into the flat-surface flow cell unit; and
   a magnetic field application unit for allowing a magnetic line of force to pass through the laser beam-applied flat sheet surface perpendicularly or almost perpendicularly;
   wherein an alkali metal of the optically-pumping catalyst is deposited inside the facing flat sheet surface opposite the laser beam-applied flat sheet surface, and
   wherein the deposition of the alkali metal is formed at a state where a temperature of the alkali metal-deposited flat sheet surface is lower than temperatures of a reservoir of the alkali metal and inside thereof by 5° C. to 200° C. at a state where both the reservoir of the alkali metal and the flat-surface flow cell unit are in a high vacuum of $10^{-5}$ Pa or less.

2. The nuclear spin polarized rare gas production device according to claim 1, wherein a temperature control unit is provided, which can maintain a vapor pressure of the optically-pumping catalyst so that a strength of the laser beam on the flat sheet surface facing the laser beam-applied flat sheet surface may decrease 1/10 or more of a strength of the laser beam on the laser beam-applied flat sheet surface.

3. A nuclear spin polarized rare gas production method comprising:
   producing the nuclear spin polarized rare gas from the rare gas flowed in the flat-surface flow cell unit in the polarized rare gas production device according to claim 2.

4. The nuclear spin polarized rare gas production device according to claim 1, wherein the flat-surface flow cell unit is made of a material which does not absorb the applied laser beam substantially, and does not discharge water or volatile components.

5. A nuclear spin polarized rare gas production method comprising:
   producing the nuclear spin polarized rare gas from the rare gas flowed in the flat-surface flow cell unit in the polarized rare gas production device according to claim 4.

6. The nuclear spin polarized rare gas production device according to claim 1, wherein the magnetic field application unit has an air core structure.

7. A nuclear spin polarized rare gas production method comprising:
   producing the nuclear spin polarized rare gas from the rare gas flowed in the flat-surface flow cell unit in the polarized rare gas production device according to claim 6.

8. The nuclear spin polarized rare gas production device according to claim 1, wherein at least an inner wall of a pipe to which the laser beam is not applied in a downstream of the flat-surface flow cell unit is made of a material which does not promote disappearance of the polarized rare gas.

9. A nuclear spin polarized rare gas production method comprising:
   producing the nuclear spin polarized rare gas from the rare gas flowed in the flat-surface flow cell unit in the polarized rare gas production device according to claim 8.

10. The nuclear spin polarized rare gas production device according to claim 1, wherein a nuclear magnetic resonance device is arranged in a downstream of the flat-surface flow cell unit, and the polarized rare gas is continuously generated to perform NMR measure in a short period of time without substantially reducing a polarization rate.

11. A nuclear spin polarized rare gas production method comprising:
    producing the nuclear spin polarized rare gas from the rare gas flowed in the flat-surface flow cell unit in the polarized rare gas production device according to claim 10.

12. The nuclear spin polarized rare gas production device according to claim 1, wherein the optically-pumping catalyst is the alkali metal rubidium (Rb).

13. A nuclear spin polarized rare gas production method comprising:
    producing the nuclear spin polarized rare gas from the rare gas flowed in the flat-surface flow cell unit in the polarized rare gas production device according to claim 12.

14. The nuclear spin polarized rare gas production device according to claim 1, wherein the mixture gas in the flat-surface flow cell unit further comprises quencher gas.

15. A nuclear spin polarized rare gas production method comprising:
    producing the nuclear spin polarized rare gas from the rare gas flowed in the flat-surface flow cell unit in the polarized rare gas production device according to claim 14.

16. A nuclear spin polarized rare gas production method comprising:
    producing the nuclear spin polarized rare gas from the rare gas flowed in the flat-surface flow cell unit in the polarized rare gas production device according to claim 1.

* * * * *